United States Patent [19]

Murotani

[11] Patent Number: 5,175,707
[45] Date of Patent: Dec. 29, 1992

[54] SEMICONDUCTOR MEMORY DEVICE HAVING A DRIVING CIRCUIT PROVIDED IN ASSOCIATION WITH A HIGH SPEED SENSE AMPLIFIER CIRCUIT

[75] Inventor: Tatsunori Murotani, Tokyo, Japan

[73] Assignee: NEC Corporation, Japan

[21] Appl. No.: 601,290

[22] Filed: Oct. 22, 1990

[30] Foreign Application Priority Data

Oct. 27, 1989 [JP] Japan .................................. 1-281283

[51] Int. Cl.[5] .............................................. G11C 7/00
[52] U.S. Cl. ........................... 365/230.06; 365/189.09; 365/205; 365/233; 365/189.07
[58] Field of Search .......... 365/203, 204, 205, 189.09, 365/189.07, 189.11, 190, 202, 226, 233, 230.06

[56] References Cited

U.S. PATENT DOCUMENTS 4,951,256 8/1990 Tobita ...................... 365/189.11 X Primary Examiner—Joseph A. Popek
Attorney, Agent, or Firm—Laff, Whitesel, Conte & Saret

[57] ABSTRACT

A semiconductor memory device comprises memory cell array, bit line pairs respectively coupled to the columns of the memory cells, sense amplifier circuits operative to increase small differences in voltage level on the bit line pairs, first and second voltage lines supplying a high voltage level and the ground voltage level through the sense amplifier circuits to the bit line pairs for increasing the small difference, and a driving circuit operative to activate the sense amplifier circuits, wherein the driving circuit comprises an equalizing circuit for equalizing the first and second voltage lines to an intermediate voltage level, a first transistor coupled between the first voltage line and a source of an external voltage level higher than the high voltage level, a second transistor providing a conduction path between a source of the second voltage level and the second voltage line in the presence of a control signal and isolating the second voltage line from the source of the second voltage level in the absence of the control signal, and a control circuit causing the first transistor to produce the high voltage level in the presence of another control signal and to isolate the first voltage line from the source of the external voltage level in the absence of the control signal.

4 Claims, 6 Drawing Sheets

SEMICONDUCTOR MEMORY DEVICE HAVING A DRIVING CIRCUIT PROVIDED IN ASSOCIATION WITH A HIGH SPEED SENSE AMPLIFIER CIRCUIT

FIELD OF THE INVENTION

This invention relates to a semiconductor memory device and, more particularly, to a driving circuit for a high speed sense amplifier circuit incorporated in the semiconductor memory device.

DESCRIPTION OF THE RELATED ART

The integration density of a semiconductor memory device has been increased at an annual rate of 4/3, and 1 mega bit dynamic random access memory devices are presently manufactured. Such a rapid progress is achieved by scaling down the minimum device dimensions, and a 1-micron design rule is employed in the 1 mega bit dynamic random access memory devices. A 0.8-micron design rule will be employed in the next generation or a 4 mega bit dynamic random access memory device, and the minimum device dimensions would be decreased to 0.6 micron for 16 mega bit dynamic random access memory devices.

Thus, the reduction of the minimum device dimensions supports the progress of the integration density, but the power voltage level has been 5 volts since the 64 kilo bit dynamic random access memory device. Such a high power voltage level is causative of the undesirable short channel phenomenon as well as damages of the gate oxide films of the component transistors and of the dielectric films of the component storage capacitors, and various improvements have been made on the circuit behavior and on the structure of the component transistor. However, these solutions are getting close to the limits, and a reduced power voltage level is expected to solve the drawbacks.

However, most of the other semiconductor devices currently available are designed to behave at 5 volts, and it makes an electronic system complex to supply a reduced power voltage level to component semiconductor memory devices only. In view of compatibility with the other component semiconductor devices, an internal step-down power supply circuit is desirable for the semiconductor memory device. Since the 5-volt power voltage level is acceptable for the semiconductor memory device with the internal step-down power supply circuit, the reduced voltage level has no influence on any electronic system. Thus, the internal step-down power supply circuit is an attractive candidate for an ultra large scale integration circuit such as the random access memory device of the next generation. In the random access memory device with an ultra large scale integration density, an extremely thin dielectric film is employed in the storage capacitor, because such an extremely thin dielectric film prevents the storage capacitor from reduction in capacitance even if the dimensions are scaled down. This means that the dielectric film is the most critical element and much liable to be damaged by a high power voltage level. For this reason, the reduced power voltage is supplied to memory cells each having a storage capacitor associated with a switching transistor while data bits are written or refreshed; however, nonreduced power voltage level is still supplied to the other component circuits such as address decoder circuits because of the operational speed.

FIG. 1 shows a typical example of a driving circuit 1 provided in association with a plurality of sense amplifier circuits 2a and 2b. Though not shown in FIG. 1, the sense amplifier circuits 2a and 2b are respectively coupled to columns of memory cells through bit line pairs BL1 and BL2, and each of the sense amplifier circuits 2a and 2b is implemented by two series combinations of p-channel type and n-channel type field effect transistors QP1, QP2, QN1 and QN2 coupled in parallel between two voltage lines 3 and 4. The gate electrodes of the field effect transistors QP1 and QN1 are coupled to the common drain D1 node of the field effect transistors QP2 and QN2, and the gate electrodes of the field effect transistors QP2 and QN2 are coupled to the common drain node D2 of the other transistors QP1 and QN1. The driving circuit 1 comprises an internal step-down power supply circuit 5, an equalizing circuit 6 and two switching transistors 7a and 7b. The switching transistor 7a is implemented by a p-channel type field effect transistor, and an n-channel type field effect transistor forms the switching transistor 7b. The internal step-down power supply circuit 5 has an operational amplifier circuit 5a and a p-channel type field effect transistor 5b coupled between a power voltage source Vcc and a node N1 and is operative to produce a reduced voltage level Vcc' and regulate the reduced voltage level Vcc at the node N1 constant with reference to a reference voltage level Vref. The equalizing circuit 6 has three n-channel type field effect transistors 6a, 6b and 6c. The n-channel type field effect transistors 6a and 6b are coupled between the voltage lines 3 and 4 and a reduced voltage source Vcc'/2, respectively, and the n-channel type field effect transistor 6c is coupled between the voltage lines 3 and 4. A first control signal CTL1 is supplied to the gate electrodes of the n-channel type field effect transistors 6a to 6c, and second and third control signals CTL2 and CTL3 are supplied to the respective switching transistors 7a and 7b.

In operation, the signal lines 3 and 4 are charged from Vcc'/2 voltage source through the n-channel type field effect transistors 6a and 6b and equalized through the n-channel type field effect transistor 6c while the first control signal CTL1 remains in the high voltage level. Since the second and third control signals CTL2 and CTL3 allows the switching transistors 7a and 7b to be turned off, the voltage lines 3 and 4 are in Vcc'/2 voltage level.

At time t1, the first control signal CTL1 goes down to the low voltage level, the n-channel type field effect transistors 6a, 6b and 6c turn off, and the voltage lines 3 and 4 are isolated from the Vcc'/2 voltage source. If data bits are read out from the memory cells to the bit line pairs BL1 and BL2 and, accordingly, small differences in voltage level take place, the second control signal CTL2 goes down to the low voltage level and the third control signal CTL3 goes up to the high voltage level at time t2. The switching transistors 7a and 7b turn on to provide conduction paths between the node N1 and the voltage line 3 and between the voltage line 4 and the ground node. Then, the sense amplifier circuits 2a and 2b are activated, and the small differences on the bit line pairs BL1 and BL2 are increased in magnitude for refreshing around time t3. If the second and third control signals CTL2 and CTL3 are respectively recovered to the high and low voltage levels at time t4, the voltage lines 3 and 4 are isolated from the node N1 and the ground node. At time t5, the first control signal CTL1 is recovered to the high voltage level, and the voltage lines are charged to the Vcc'/2 voltage level again. Since the nodes D1 and D2 are coupled to the voltage line 3 through the p-channel type field effect transistors QP1 and QP2, the voltage levels at the nodes D1 and D2 and, accordingly, the bit line pairs BL1 and BL2 never exceed the Vcc/2 voltage level. While the small difference in coltage level is increased for refreshing, a voltage difference equal to Vcc' takes place on the bit line pairs BL1 and BL2 and is fed back to the storage capacitors of the memory cells. Such a relatively low voltage difference never damages the storage capacitors. This enhances the reliability of the data bits stored in the memory cells.

However, a problem is encountered in the prior art semiconductor memory device with an ultra large integration density in that the operational speed of the sense amplifier circuits are too small to be acceptable for an electronic system. This is because of the fact that the source voltage level Vcc is transferred to the voltage line 3 through not only the p-channel type field effect transistor 5b but also the switching transistor 7a. The p-channel type field effect transistor 5b is indispensable for reduction of the power voltage level Vcc, and the equalization in voltage level between the voltage lines 3 and 4 needs the switching transistor 7a. The operational speed may be increased with large transistors 5b and 7a; however, such large transistors 5b and 7a occupy a large amount of real estate and, accordingly, enlarge the semiconductor chip size. Thus, there is a trade-off between the operational speed and the semiconductor chip size, and it is necessary for the random access memory device to employ an improved driving circuit so as to increase the operational speed of the sense amplifier circuits 2a and 2b without sacrifice the semiconductor chip size.

SUMMARY OF THE INVENTION

It is therefore an important object of the present invention to provide a semiconductor memory device which is improved in the operational speed of the sense amplifier circuits.

To accomplish these objects, the present invention proposes to achieve a voltage regulation as well as an isolation by means of a single transistor.

In accordance with the present invention, there is provided a semiconductor memory device comprising a) a plurality of memory cells arranged in rows and columns and respectively storing data bits, b) a plurality of bit line pairs respectively provided in association with the columns of the memory cells, the data bits read out from the memory cells producing small differences in voltage level on the bit line pairs, respectively, c) a plurality of sense amplifier circuits respectively coupled to the bit line pairs and operative to increase the small differences in voltage level, thereby supplying large differences in voltage level to the bit line pairs, the large differences being approximately equal to a difference between first and second voltage levels, d) first and second voltage lines supplying the first and second voltage levels through the sense amplifier circuits to the bit line pairs, and e) a driving circuit responsive to at least first, second and third control signals and operative to activate the sense amplifier circuits for producing the large differences, the driving circuit comprising e-1) an equalizing circuit equalizing the first and second voltage lines to an intermediate voltage level between the first and second voltage levels in the presence of the first control signal and isolating the first and second voltage lines from a source of the intermediate voltage level in the absence of the first control signal, e-2) a first transistor coupled between a source of a third voltage level and the first voltage line, the third voltage level being outside a voltage range between the first and second voltage levels, e-3) a second transistor providing a conduction path between a source of the second voltage level and the second voltage line in the presence of the second control signal and isolating the second voltage line from the source of the second voltage level in the absence of the second control signal, and e-4) a control circuit allowing the first transistor to produce the first voltage level from the third voltage level in the presence of the third control signal and causing the first transistor to isolate the first voltage line from the source of the third voltage level in the absence of the third control signal.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
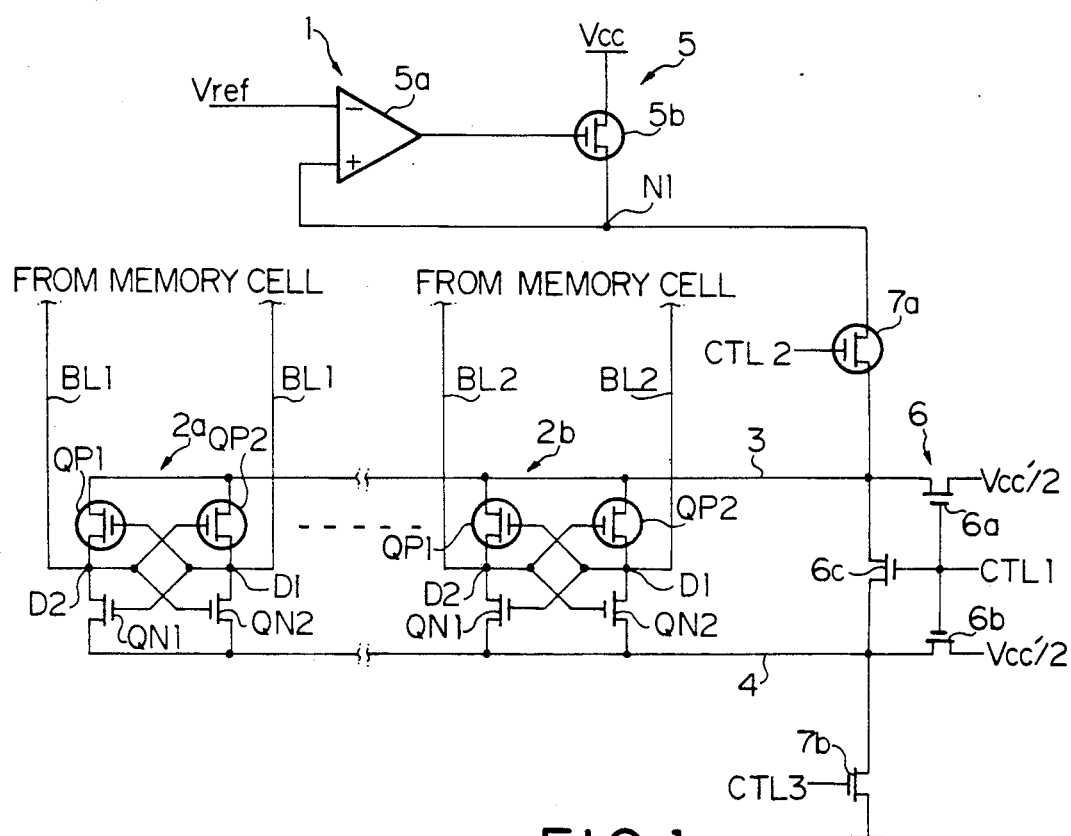
FIG. 1 is a circuit diagram showing the arrangement of a driving circuit and sense amplifier circuits incorporated in a prior art random access memory device.
Figure 2:
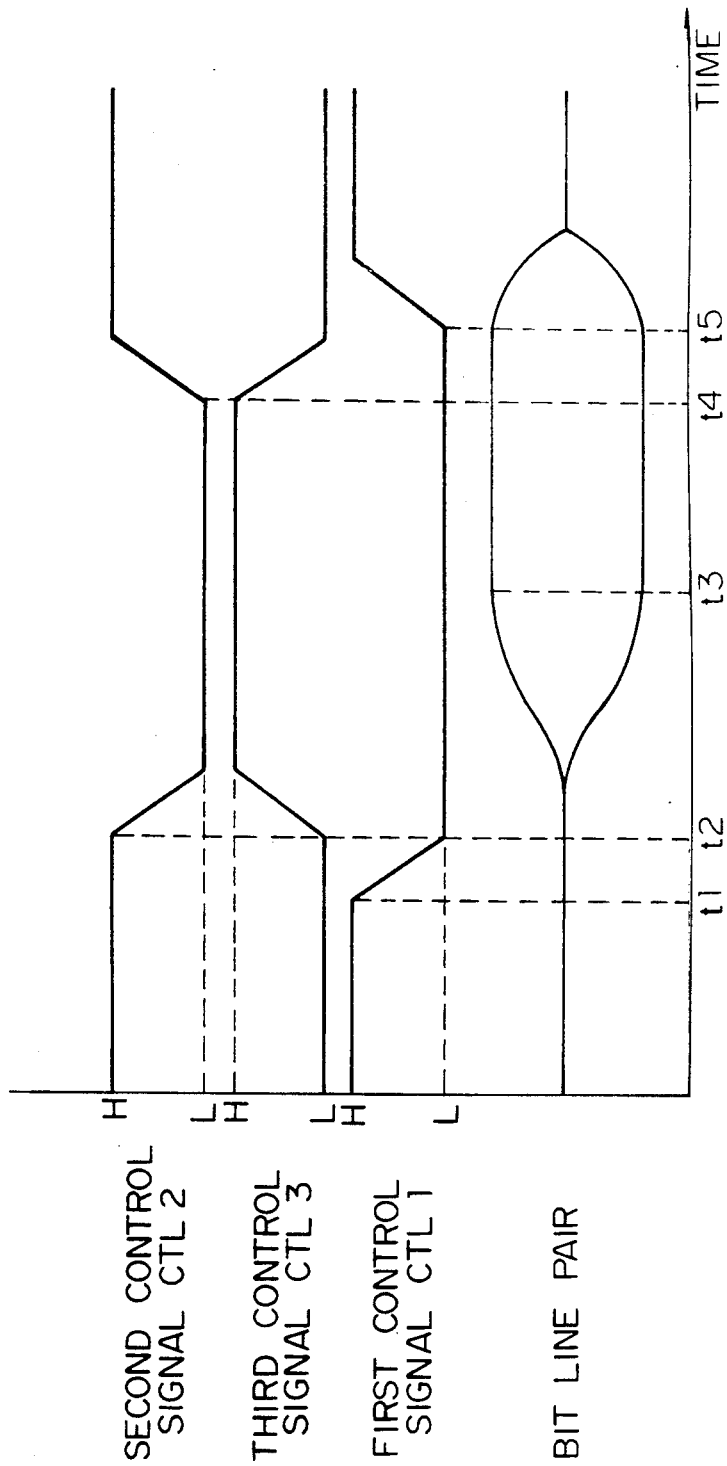
FIG. 2 is a diagram showing the waveforms of essential signals supplied to the driving circuit shown in FIG. 1.
Figure 3:
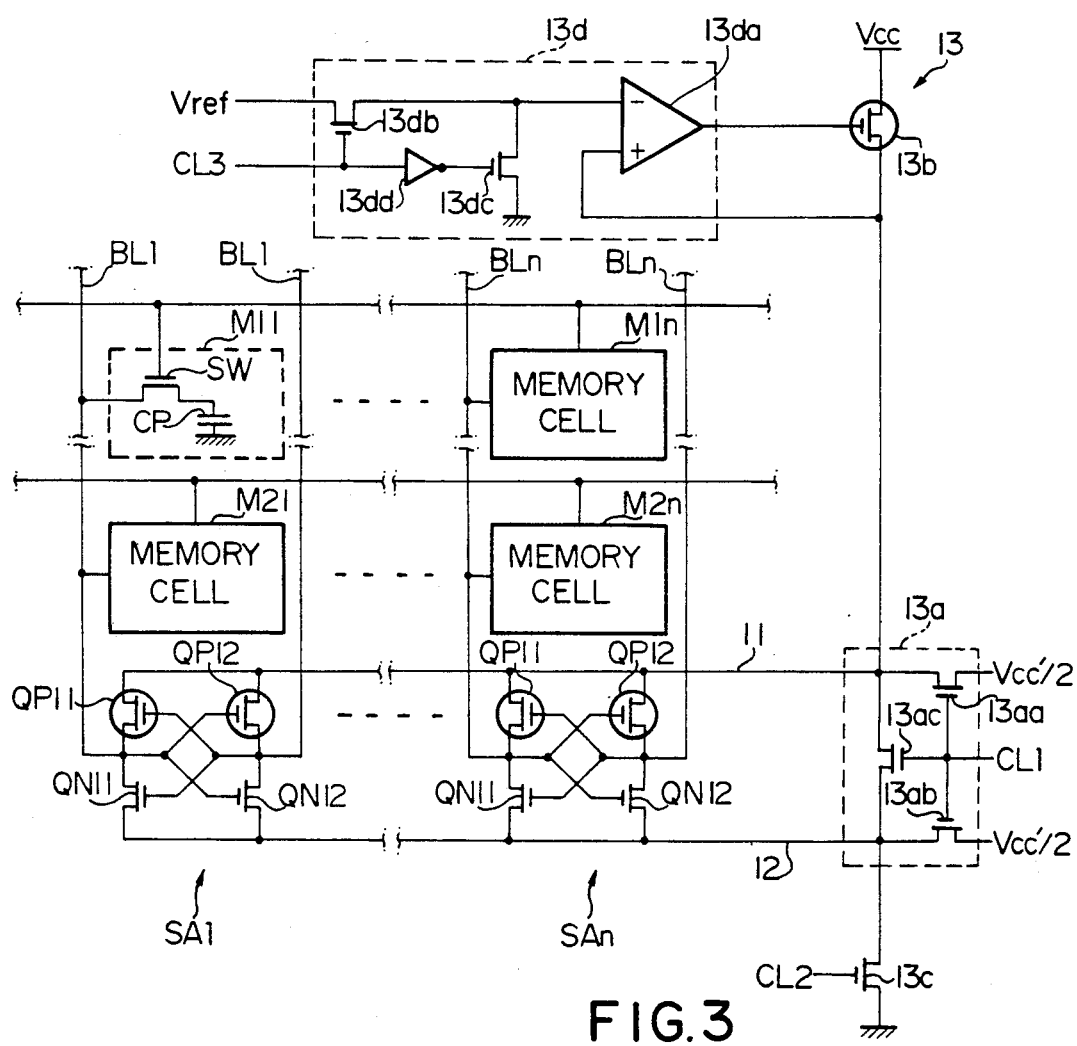
FIG. 3 is a circuit diagram showing the arrangement of a random access memory device according to the present invention.

Referring first to FIG. 3 of the drawings, a semiconductor memory device embodying the present invention is fabricated on a single semiconductor chip and comprises a plurality of memory cells including memory cells M11, M1n, M21 and M2n. In this instance, each of the memory cells M11 to M2n is implemented by a series combination of a switching transistor SW and a storage capacitor CP, and a data bit is stored in the storage capacitor CP in the form of electric charges. A plurality of bit line pairs BL1 to BLn are provided in association with the columns of the memory cells M11 to M2n. The data bits are read out from the memory cells to the bit lines coupled thereto, and a reference voltage level is supplied to the other bit lines so that small differences in voltage level take place on the bit line pairs BL1 to BLn. The bit line pairs BL1 to BLn are further coupled to a plurality of sense amplifier circuits SA1 to SAn, and each of the sense amplifier circuits SA1 to SAn is implemented by two series combinations of p-channel type and n-channel type field effect transistors QP11, QP12, QN11 and QN12. The series combinations are coupled between a first voltage line 11 and a second voltage line 12, and the first and second voltage lines 11 and 12 are supplied from a driving circuit 13 with a positive voltage level Vcc' and the ground voltage level. The positive voltage level is lower than a power voltage level Vcc supplied from an external power source as will be understood from the later description. The gate electrodes of the field effect transistors QP11 and QN11 are coupled to one of the bit lines of the associated bit line pair, and the other bit line of the associated bit line pair is coupled to the gate electrodes of the field effect transistors QP12 and QN12. The small differences on the bit line pairs BL1 to BLn are rapidly increased in magnitude by the aid of the sense amplifier circuits SA1 to SAn coupled thereto, respectively, and, accordingly, large differences in voltage level take place on the bit line pairs BL1 to BLn. In this instance, the large differences do not exceed a voltage range between the positive voltage level Vcc' and the ground voltage level. In this instance, the positive voltage level Vcc' and the ground voltage level are tantamount to first and second voltage levels.

The driving circuit 13 comprises an equalizing circuit 13a, a first field effect transistor 13b implemented by a p-channel type field effect transistor, a second field effect transistor 13c implemented by an n-channel type field effect transistor, and a control circuit 13d. The equalizing circuit 13a has third, fourth and fifth field effect transistors 13aa, 13ab and 13ac, and the third and fourth field effect transistors 13aa and 13ab are coupled between the first and second voltage lines 11 and 12 and a source of an intermediate voltage level Vcc'/2 as large as a half of the positive voltage level Vcc'. The fifth field effect transistor 13ac is coupled between the first and second voltage lines 11 and 12, and a first clock signal CL1 is supplied to the gate electrodes of the third, fourth and fifth field effect transistors 13aa, 13ab and 13ac. In this instance, the first clock signal CL1 of a positive high voltage level serves as a first control signal.

The first field effect transistor 13b is couple between the first voltage line 11 and a source of the external voltage level Vcc higher than the positive voltage level Vcc, and the second field effect transistor 13c is coupled between the second voltage line 12 and a source of the ground voltage level. A second clock signal CL2 is supplied to the gate electrode of the second field effect transistor 13c, and the second clock signal of the positive high voltage level serves as a second control signal.

The control circuit 13d comprises an operational amplifier circuit 13da, and the output node and the noninverting node thereof are coupled to the gate electrode of the first field effect transistor 13b and the first voltage line 11, respectively. The control circuit 13d further comprises a sixth field effect transistor 13db coupled between a source of reference voltage level Vref and the inverting node of the operational amplifier circuit 13da, a seventh field effect transistor 13dc coupled between the inverting node and the source of the ground voltage level, and an inverter circuit 13dd coupled to the gate electrode of the seventh field effect transistor 13dc. The reference voltage level Vref is as large as the positive voltage level Vcc'. A third clock signal CL3 is supplied to the gate electrode of the sixth field effect transistor 13db and the input node of the inverter circuit 13dd, and the third clock signal of the positive high voltage level serves as a third control signal. The control circuit 13d thus arranged allows the first field effect transistor 13b to regulate the voltage level on the first voltage line 11 with reference to the voltage level at the inverting node of the operational amplifier circuit 13da. Namely, if the third clock signal remains in the positive high voltage level, the sixth field effect transistor 13db transfers the operational amplifier circuit 13da, and the operational amplifier circuit 13da controls the first field effect transistor 13b in such a manner as that the positive voltage level Vcc' takes place on the first voltage line 11. Since the first field effect transistor 13b decreases the voltage level Vcc depending upon the channel conductance thereof, the voltage level Vcc' is surely lower than the voltage level Vcc. However, if the third clock signal goes down to the ground voltage level, the ground voltage level is supplied through the seventh field effect transistor 13dc to the inverting node of the operational amplifier circuit 13da. Then, the operational amplifier circuit 13da causes the first field effect transistor 13b to turn off, and, for this reason, the first voltage line 11 is isolated from the source of the external voltage level Vcc. Although various peripheral circuits such as, for example, address decoder circuits are incorporated in the semiconductor memory device, no description is incorporated hereinbelow for the sake of simplicity.

Figure 4:
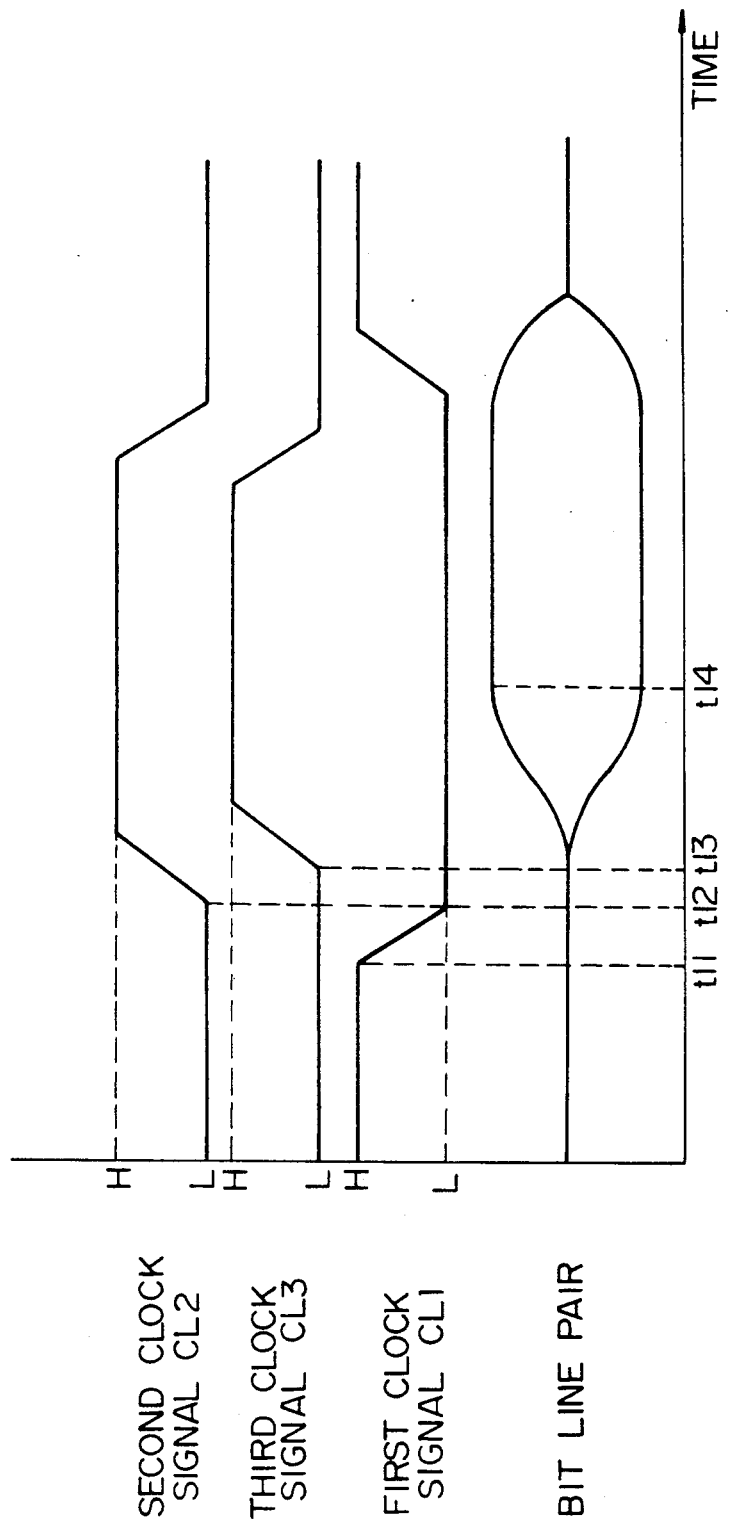
FIG. 4 is a diagram showing the waveforms of essential signals supplied to the random access memory device shown in FIG. 3.

Description is made on circuit behavior with reference to FIG. 4. While the first clock signal CL1 remains in the positive high voltage level, the third, fourth and fifth field effect transistors 13aa, 13ab and 13ac are turned on so that conduction paths are established between the source of the intermediate voltage level Vcc'/2, the first voltage line 11 and the second voltage line 12. Since the second and third clock signals CL2 and CL3 are in the ground voltage level, the first and second voltage lines 11 and 12 are strictly equalized to the intermediate voltage level Vcc'/2. The first clock signal CL1 goes down to the ground voltage level at time t11, and the first and second voltage lines 11 and 12 are isolated from the source of the intermediate voltage level Vcc'/2 as well as from each other.

The small differences in voltage level are assumed to take place on the bit line pairs BL1 to BLn, respectively The second clock signal CL2 goes up to the positive high voltage level at time t12, and the second field effect transistor 13c turns on to provide a conduction path between the second voltage line 12 and the source of the ground voltage level. If the third clock signal CL3 goes up to the positive voltage level at time t13, the reference voltage level Vref is supplied through the sixth field effect transistor 13db to the inverting node of the operational amplifier circuit 13da, and the operational amplifier circuit 13da allows the first field effect transistor 13b to regulate the voltage level on the first voltage line 11 at the positive voltage level Vcc'. The positive voltage level vcc' and the ground voltage level are supplied through the p-channel type field effect transistor Qp11 or Qp12 and the n-channel type field effect transistor QN11 or QN12 of each sense amplifier circuit to each of the bit line pairs BL1 to BLn, and the small differences on the bit line pairs BL1 to BLn are increased in magnitude. Thus, large differences in voltage level take place on the bit line pairs BL1 to BLn, but the voltage levels on the bit lines never exceed the positive voltage level Vcc.

Since the first field effect transistor 13b is directly coupled to the first voltage line, the positive voltage level Vcc' is high enough to speed up the sense amplifier circuits SA1 to SAn even if the first field effect transistor 13b is small in size. But, the positive voltage level Vcc' is not too high to damage the dielectric films of the storage capacitors CP. Thus, the semiconductor memory device according to the present invention is improved in the access speed without sacrifice of the semiconductor chip size. Moreover, the reduced power voltage level Vcc' does not deteriorate the reliability of the data bits stored in the memory cells M11 to M2n.

Second Embodiment

Figure 5:
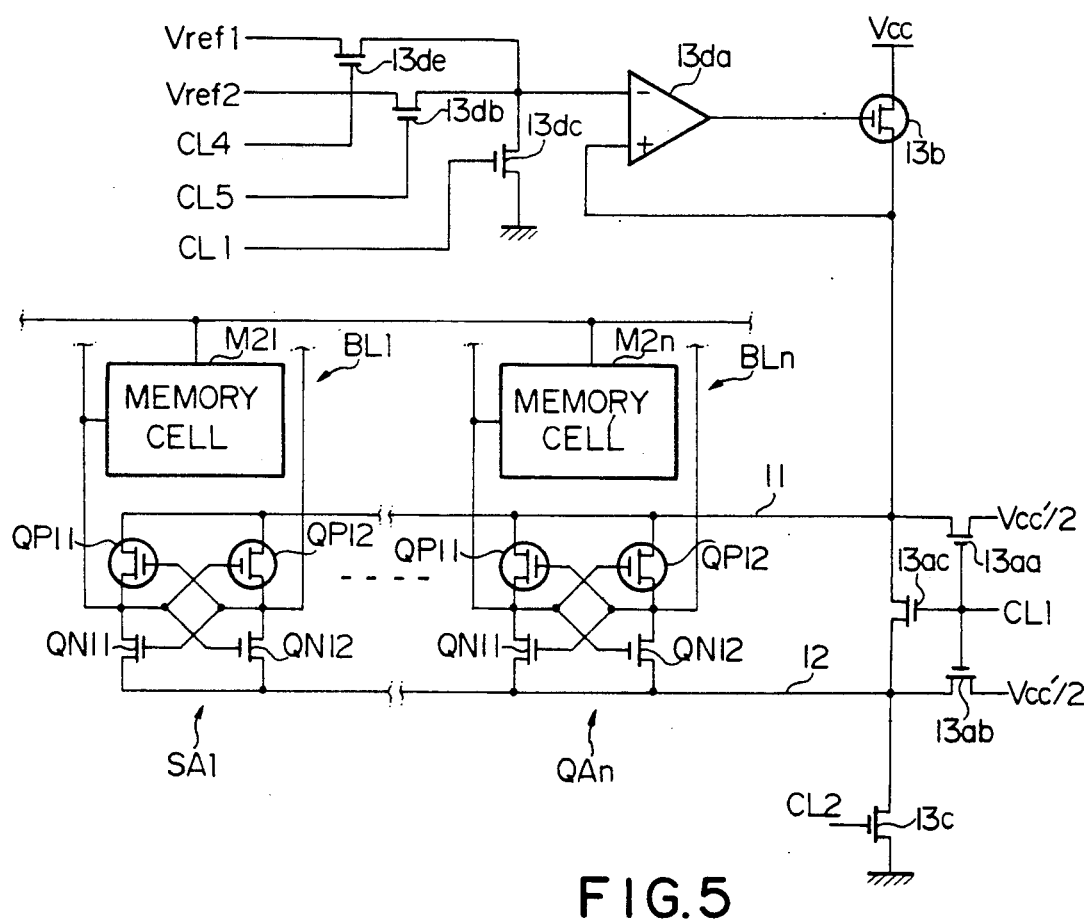
FIG. 5 is a circuit diagram showing the arrangement of another random access memory device according to the present invention.
Figure 6:
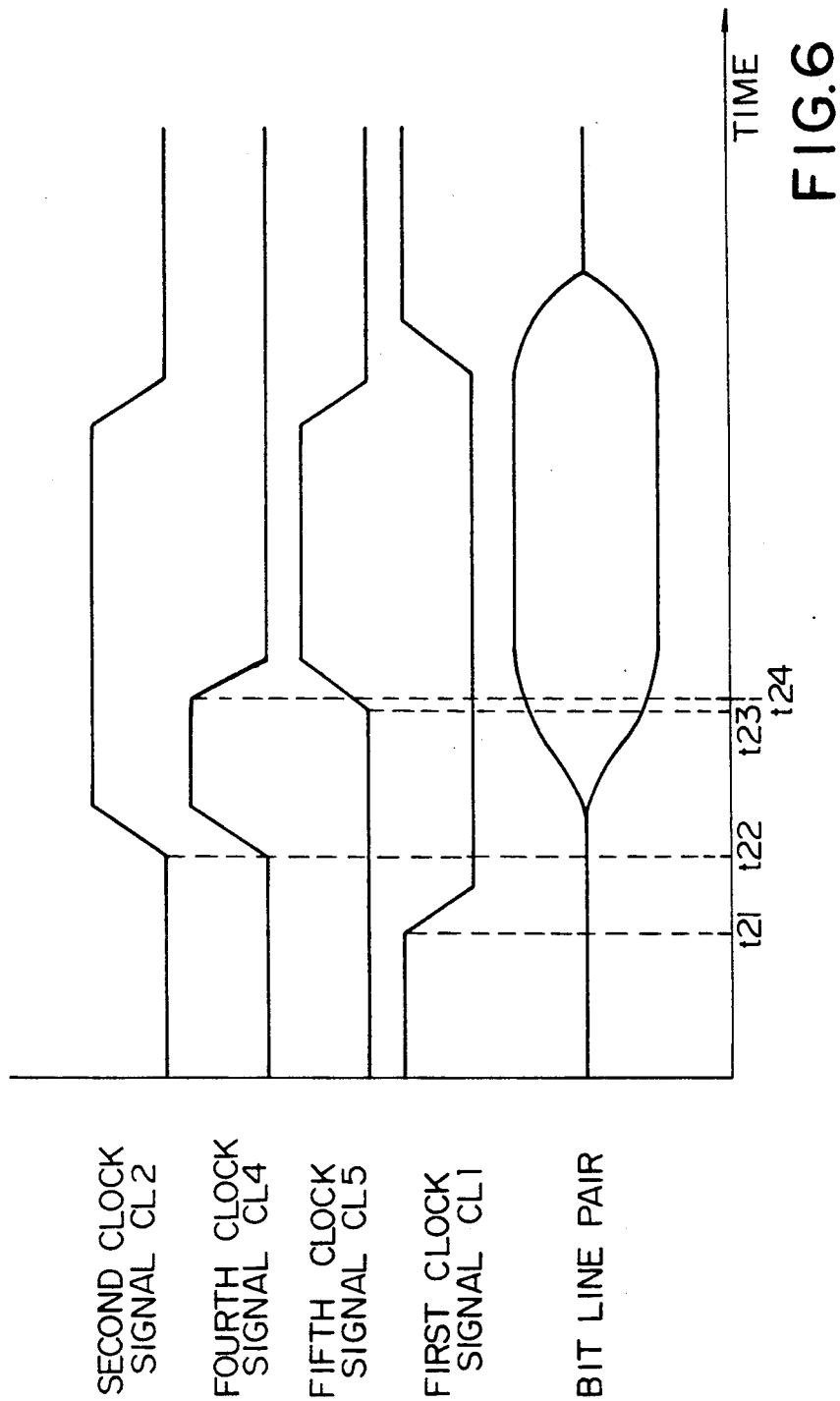
FIG. 6 is a diagram showing the waveforms of essential signals supplied to the random access memory device shown in FIG. 5.

Turning to FIG. 5 of the drawings, another semiconductor memory device embodying the present invention is illustrated. The semiconductor memory device illustrated in FIG. 5 is similar to that shown in FIG. 3 with the exception of an eighth field effect transistor 13de coupled between the inverting node of the operational amplifier circuit 13da and a source of another reference voltage level vref', and, for this reason, corresponding component elements and signals are designated by the same reference marks as those used in FIG. 3. The first clock signal CL1 and fourth and fifth clock signals CL4 and CL5 are respectively supplied to the seventh, eighth and sixth field effect transistors 13dc, 13de and 13db, and either clock signal CL4 or CL5 of the positive high voltage level as well as the clock signal CL1 of the ground voltage level as a whole serve as the third control signal. The eighth field effect transistor 13de is coupled between the inverting node of the operational amplifier circuit 13da and a source of a first reference voltage level Vref1, and the sixth field effect transistor 13db is coupled between the inverting node of the operational amplifier circuit 13da and a source of a second reference voltage level Vref2. The reference voltage levels Vref1 and Vref2 are different from each other.

In operation, while the first clock signal remains in the positive high voltage level, the first and second voltage lines 11 and 12 are precharged and equalized to the intermediate voltage level Vcc'/2 through the third to fifth field effect transistors 13aa to 13ac. With the first clock signal CL1 of the positive high voltage level, the seventh field effect transistor 13dc is turned on to transfer the ground voltage level to the inverting node of the operational amplifier circuit 13da, and the operational amplifier circuit 13da causes the first field effect transistor 13b to turn off. The second field effect transistor 13c isolates the second voltage line 12 from the ground voltage level with the second clock signal of the ground voltage level. If the first clock signal CL1 goes down to the ground voltage level at time t21, the first and second voltage lines 11 and 12 are isolated from the source of the intermediate voltage level Vcc'/2 because of the third to fifth field effect transistors 13aa to 13ac to be turned off. The first clock signal CL1 of the ground voltage level causes the seventh field effect transistor 13dc to turn off, and the inverting node of the operational amplifier circuit 13da is blocked from the source of the ground voltage level.

The second and fourth clock signals CL2 and CL4 go up to the positive high voltage level at time t22, and the second and eighth field effect transistors 13c and 13de turn on. The second field effect transistor 13c supplies the ground voltage level to the second voltage line 12, and the first reference voltage level Vref1 is transferred to the inverting node of the operational amplifier circuit 13da. The operational amplifier circuit 13da controls the first field effect transistor 13b so that the positive voltage level Vcc' on the first voltage line 11 is regulated to the first reference voltage level. With the positive voltage level Vcc' and the ground voltage level, the sense amplifier circuits SA1 and San increase small differences in voltage level on the bit line pairs BL1 to BLn. If the first reference voltage level Vref1 is higher than the second reference voltage level Vref2, the small differences are rapidly increased.

If the fifth clock signal CL5 goes up to the positive high voltage level at time t23, the sixth field effect transistor 13db turns on, and the second reference voltage level Vref2 is supplied to the inverting node of the operational amplifier circuit 13da. Since the fourth clock signal CL4 is recovered to the ground voltage level at time t24, the inverting node of the operational amplifier circuit 13da is blocked from the source of the first reference voltage level Vref1. The positive voltage level Vcc' is regulated to the second reference voltage level Vref2, and one of the bit lines of each bit line pair is gradually saturated to the positive voltage level Vcc' or the second reference voltage level Vref2. Thus, the semiconductor memory device shown in FIG. 5 is further improved in operational speed by the agency of the first reference voltage level Vref1.

As will be understood from the foregoing description, the semiconductor memory device according to the present invention is improved in the access speed without sacrifice of the semiconductor chip size by the aid of the improved driving circuit.

Although particular embodiments of the present invention have been shown and described, it will be obvious to those skilled in the art that various changes and modifications may be made without departing from the spirit and scope of the present invention. For example, the channel conductivity types, i.e. p-channel type field effect transistors and n-channel type field effect transistors, may be replaced with each other. Moreover, various magnitudes may be given to the first and second reference voltage levels Vref1 and Vref2.

What is claimed is:

1. A semiconductor memory device comprising:
a) a plurality of memory cells arranged in rows and columns and respectively storing data bits,
b) a plurality of bit line pairs respectively provided in association with the columns of said memory cells, said data bits read out from said memory cells producing small differential voltage levels on said bit line pairs, respectively,
c) a plurality of sense amplifier circuits respectively coupled to said bit line pairs and operative to develop said small differential voltage levels, thereby supplying large differential voltage levels to said bit line pairs, said large differential voltage levels being approximately equal to a difference between first and second voltage levels,
d) first and second voltage lines supplying said first and second voltage levels through said sense amplifier circuits to said bit line pairs, and
e) a driving circuit responsive to at least first, second and third control signals and operative to activate said sense amplifier circuits for producing said large differential voltage levels, said driving circuit comprising (e-1) an equalizing circuit for equalizing said first and second voltage lines to an intermediate voltage level between said first and second voltage levels in the presence of said first control signal and for isolating said first and second voltage lines from a source of said intermediate voltage level in the absence of said first control signal, (e-2) a first transistor coupled between a source of a third voltage level and said first voltage line, said third voltage level being outside a voltage range between said first and second voltage levels, (e-3) a second transistor for providing a conduction path between a source of said second voltage level and said second voltage line in the presence of said second control signal and for isolating said second voltage line from said source of said second voltage level in the absence of said second control signal, and (e-4) a control circuit for allowing said first transistor to produce said first voltage level from said third voltage level in the presence of said third control signal and for causing said first transistor to isolate said first voltage line from said source of said third voltage level in the absence of said third control signal.

2. A semiconductor memory device as set forth in claim 1, in which said equalizing circuit comprises a third transistor coupled between said source of said intermediate voltage level and said first voltage line, a fourth transistor coupled between said source of said intermediate voltage level and said second voltage line and a fifth transistor coupled between said first and second transistors, and in which said first control signal is supplied to gate electrodes of said third, fourth and fifth transistors.

3. A semiconductor memory device as set forth in claim 1, in which said control circuit comprises an operational amplifier circuit having an inverting node and a noninverting node coupled to said first voltage line, a third transistor coupled between the inverting node and a source of a reference voltage level equal to said first voltage level, a fourth transistor coupled between the inverting node and said source of said second voltage level, and an inverter circuit coupled to a gate electrode of said fourth transistor, and in which said third control signal is supplied to said inverter circuit and a gate electrode of said third transistor.

4. A semiconductor memory device as set forth in claim 1, in which said control circuit comprises an operational amplifier circuit having an inverting node and a noninverting node coupled to said first voltage line, a third transistor coupled between the inverting node and a source of a reference voltage level equal to said first voltage level, a fourth transistor coupled between the inverting node and said source of said second voltage level, and a fifth transistor coupled between the inverting node and a source of another reference voltage level which is different in magnitude from said source of said reference voltage level, and in which said third control signal consisting of a plurality of clock signals is supplied to the gate electrodes of said third, fourth and fifth transistors.

* * * * *